US005942944A

United States Patent [19]

Paolella et al.

[11] Patent Number: 5,942,944

[45] Date of Patent: Aug. 24, 1999

[54] LOW LOSS BASED POWER DIVIDER/ COMBINER FOR MILLIMETER WAVE CIRCUITS

[75] Inventors: Arthur C. Paolella, Jamison, Pa.; Tsang-Der Ni, Hsinchu, Taiwan; Dana J. Sturzebecher, Devonshire, N.J.

[73] Assignee: The United States of America as represented by the Secretary of the Army, Washington, D.C.

[21] Appl. No.: 09/005,876

[22] Filed: Jan. 12, 1998

[51] Int. Cl.[6] ................................ H03F 3/60; H03F 3/68

[52] U.S. Cl. .......................... 330/286; 330/295; 333/125; 333/137

[58] Field of Search ..................................... 333/125, 137, 333/239, 248; 330/53, 124 R, 56, 286, 295

[56] References Cited

U.S. PATENT DOCUMENTS

| | | | |
|---|---|---|---|
| 3,277,489 | 10/1966 | Blaisdell | 333/125 X |
| 4,091,334 | 5/1978 | Sechi | 330/53 X |
| 4,124,823 | 11/1978 | Sechi | 330/286 X |
| 4,588,962 | 5/1986 | Saito et al. | 330/295 X |
| 4,686,494 | 8/1987 | Kaneko et al. | 333/137 |
| 4,843,353 | 6/1989 | Segueira | 333/248 X |

*Primary Examiner*—Paul Gensler

*Attorney, Agent, or Firm*—Michael Zelenka; George B. Tereschuk

[57] ABSTRACT

A power divider/combiner is formed from multimode dielectric waveguides in which energy in a single mode is translated into a plurality of modes in the multimode waveguide, each mode is separately amplified and applied to another multimode waveguide that combines the modes in phase at the output thereof.

5 Claims, 3 Drawing Sheets

LOW LOSS BASED POWER DIVIDER/COMBINER FOR MILLIMETER WAVE CIRCUITS

GOVERNMENT INTEREST

The invention described herein may be manufactured, used, sold, imported, and/or licensed by or for the Government of the United States of America without the payment to us of any royalties thereon.

FIELD OF INTEREST

This invention relates in general to millimeter wave amplifiers and in particular to millimeter wave power dividers and combiners.

BACKGROUND OF THE INVENTION

Many millimeter wave systems require high power amplifiers for the transmitter. However, the small size of high frequency devices excludes high input power to a single device as well as the generation of a useful power output. To circumvent these power limitations, many devices and/or amplifiers are combined by a series of power dividers and combiners. In a divider, the input signal power is divided and then connected to individual amplifiers or similar devices. Then, a combiner is used to add the power in phase from the individual amplifier or similar device. The output of these individual amplifiers is then recombined by a combiner. Typically, this combiner at the output of the individual amplifier is simply a divider used in a reverse mode. Traditional power dividers are metallic transmission lines which, as those skilled in the art will recognize, experience significant power loss, radiation loss, cross-talk effects and are expensive to produce at millimeter wave frequencies (due to the small size).

Therefore, there is a need in this art to provide a power divider and combiner which is not as lossy as simple metal transmission lines. The present invention addresses this need.

SUMMARY OF THE INVENTION

Accordingly, one object of the present invention is to provide an alternative to traditional metallic transmission line power dividers by using multimode dielectric waveguide components.

It is another object of the present invention to provide such multimode dielectric waveguide components that are much less lossy than metallic transmission lines.

It is still another object of the present invention to use such a multimode dielectric waveguide to produce a series of power maxima from which power will be extracted and amplified by a millimeter wave power amplifier.

These and other objects of the present invention are accomplished by using low cost, low loss multimode waveguides which are preferably used for the dividing and combining functions in a millimeter wave circuit. The signal to be amplified is communicated from a single mode waveguide to a multimode wave in which the different modes are constructively and destructively combined to produce maximum peaks of energy at the output of the multimode waveguide. Single mode waveguides are coupled where these peaks of energy are produced. These energy peaks are then amplified by power amplifiers and the outputs of the amplifiers are applied to another set of single mode waveguides coupled to these amplifiers and to an input end of another multimode waveguide. At the other end of this second multimode waveguide, the modes are combined at a single mode waveguide. The various waveguides are preferably formed by dielectric material.

BRIEF DESCRIPTION OF THE DRAWINGS

These and other features of the invention will become readily apparent in light of the Detailed Description of the Invention and the attached drawings wherein.

DETAILED DESCRIPTION OF THE INVENTION

Figure 1:
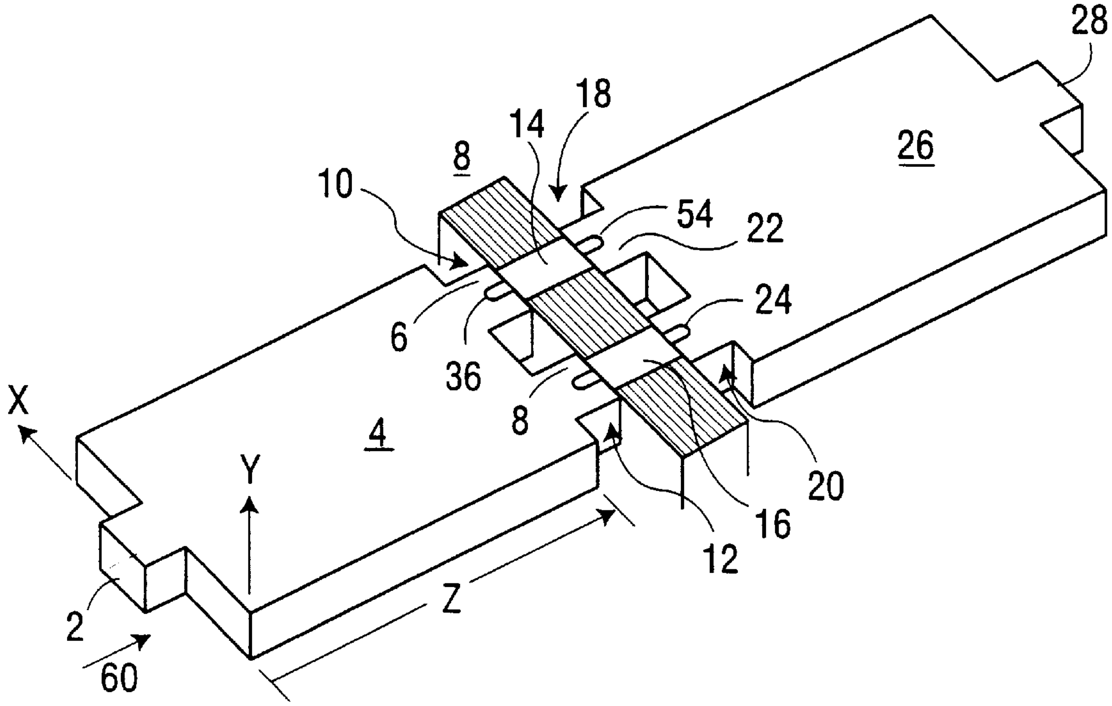
FIG. 1 is a perspective view of a power amplifier according to the present invention.

Now referring to FIG. 1, the general arrangement of the components of a power amplifier according to the present invention is illustrated wherein the signal to be amplified is introduced by means (not shown) into an input single mode waveguide 2 that is connected with a multimode waveguide 4. As will be explained, a plurality of peaks of energy resulting from constructive and destructive combinations of the modes appear at points at a distance along the z and x axes of the multimode waveguide 4. At the maximum peaks of these modes, the single mode waveguides 6 and 8 are connected to the multimode dielectric waveguide 4. The energy is extracted by the single mode waveguides which are coupled to microstrip transitions 10 and 12 that are respectively coupled to MMIC circuits (amplifiers) 14 and 16. The amplified signal then goes through the reverse process starting with the transition from the outputs of the amplifiers 14 and 16 via microstrip to single mode waveguide transitions 18 and 20 to single mode waveguides 22 and 24. A multimode waveguide 26 is coupled to the single mode waveguides 22 and 24 and the amplified modes are combined in phase (in reverse as compared to multimode waveguide 4) and then output via single mode waveguide 28.

Figure 2:
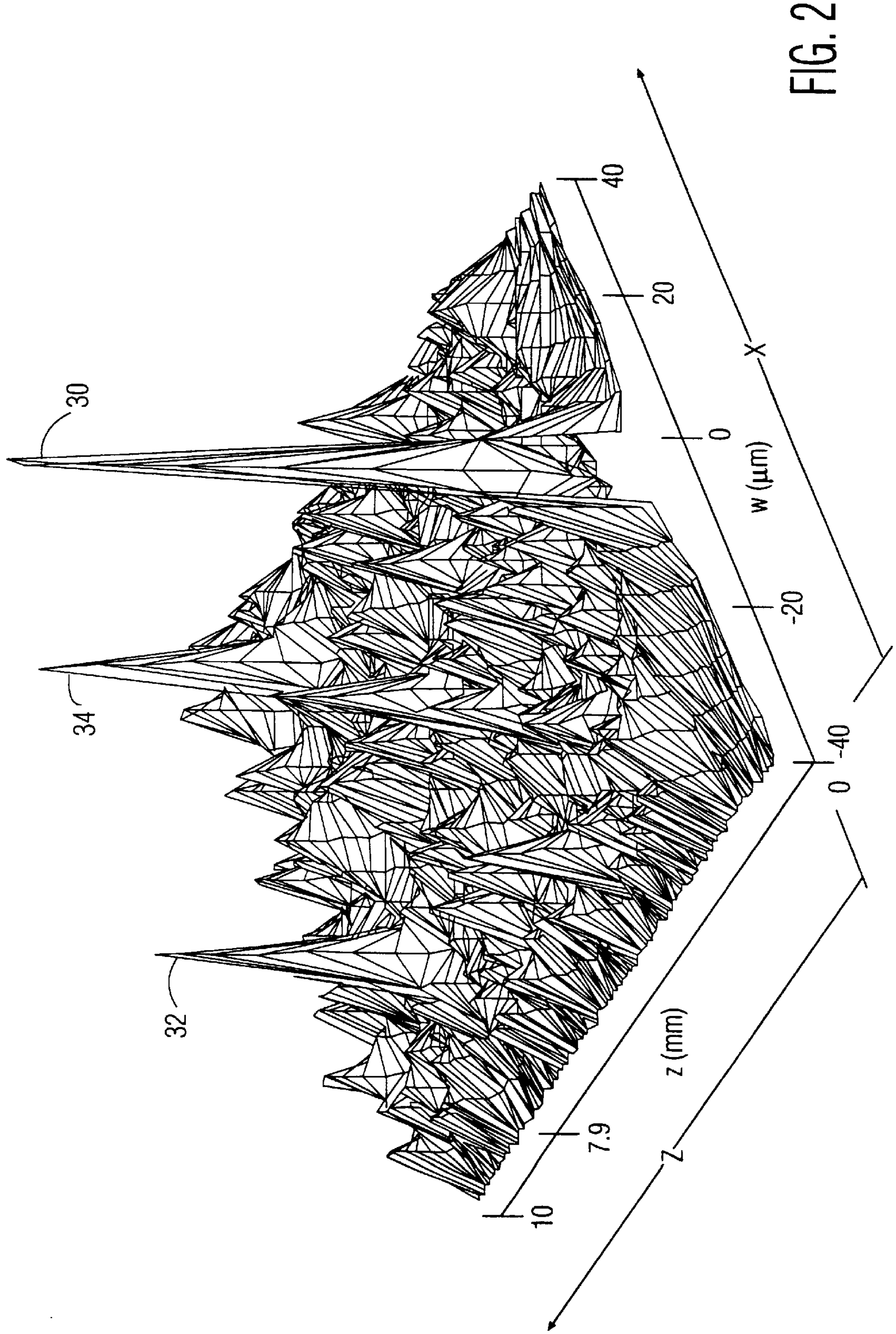
FIG. 2 illustrates various modes within a multimode waveguide showing multiple peaks at one end and single peak at the output end.

FIG. 2 is an isometric illustration of the amplitudes of the waves within multimode waveguides like 4 and 26. As shown, the tallest peak 30 represents the signal introduced at the input of the single mode waveguide 2 and peaks 32 and 34 are formed by the constructive and destructive combination of the signal through the multimode waveguide which are output through the single mode waveguides 10 and 12. Because the energy of the single mode represented by peak 30 is constructively and destructively combined in a plurality of modes in multimode waveguide 4, the peaks 32 and 34 obviously will have less amplitude than the peak at the input of the multimode waveguide. However, this reduction in amplitude is more than compensated for by the amplifiers 14 and 16 and the recombination of the power maxima by multimode waveguide 26. Assuming that the amplitudes of these peaks shown in FIG. 2 were larger, then FIG. 2 would illustrate the recombination of the power maxima in reverse. In other words, peaks 32 and 34 would represent the input of multimode waveguide 26 and peak 30 would represent the output.

Because the waveguides have a higher dielectric constant than the surrounding air, the signal wave is guided through the present invention. As shown in FIG. 1, a simple 1 to 2 divider is designed by using symmetric mode mixing in a center fed multimode planar waveguide. Thus, the resulting electric field of the millimeter wave signal in the input waveguide can be assumed to symmetric. Accordingly, the field amplitude Ex,z in the multimode waveguide 4 can be expressed as a sum of the symmetric mode, such as by the following equation:

$$E_{(x,z)} = \sum_{n=1,3,5}^{N} E\eta \mathrm{Cos}\left(\frac{\eta\pi}{w}x\right)\exp^{jk_{zn}z}$$

where N is the total of the modes in the waveguide 4, Eη is the complex amplitude of the mode, w is the width of the waveguide 4, $k_{zn}$ is the propagation constant of the $n^{th}$ mode and is defined as $k_{zn}=k-n^2\pi^2/2w^2k$ where $k=2n_c\pi/\lambda_o$, $n_c$ is the refractive index of the dielectric material and $\lambda_o$ is the wavelength of signal in free space.

Therefore, by substituting values of x and z, plots of E in the multimode waveguide 4 for each mode can be made and the peaks 32 and 34 located to determine the placement of the single mode waveguides as the outputs of the multimode waveguide. Since the relative amplitudes of these peaks is the same as would be in the multimode waveguide 26, it is only necessary to know the amplification of the amplifiers 14 and 16 in order to determine the amplitude of peak 30 when it is the desired output in the single mode waveguide 28.

Figure 3A:
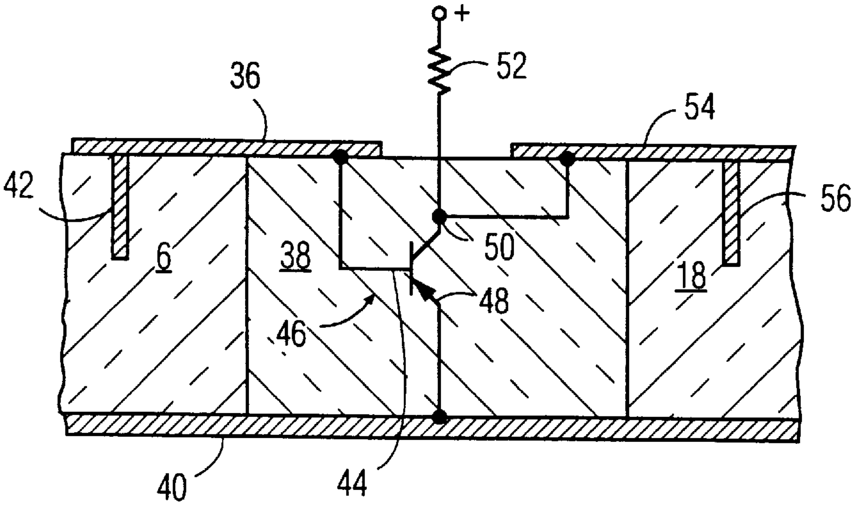
FIG. 3A is a longitudinal cross section of one type of transition between an amplifier contained in a microstrip and waveguide at its input and output.
Figure 3C:
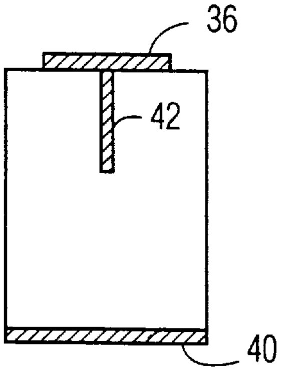
FIG. 3C is a cross section taken along 3C, 3C of FIG. 3B.
Figure 3B:
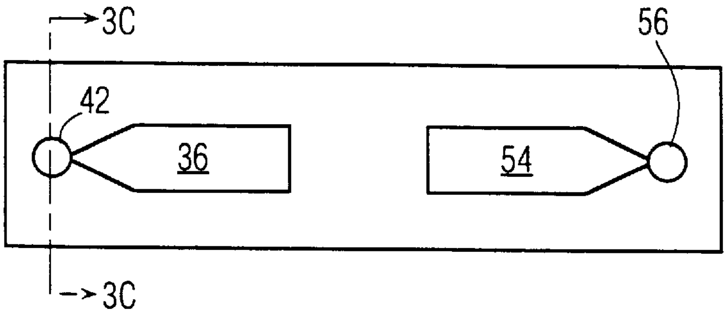
FIG. 3B is a top view of the transition of FIG. 3A.

Reference is now made to FIGS. 3A, 3B, and 3C for a description of the transition 10 between the single mode waveguide 6 and amplifier 14 as well as the coupling between the amplifier 14 and the single mode waveguide 22. These transitions shown are designed to connect the energy from the wave guide mode into a microwave circuit and then the reverse the process. Essentially the transition consists of a cylindrical metal section protruding into the waveguide to facilitate probe coupling to the microstrip transmission line. In the alternative, tapered dielectric transitions could be used to reduce reflections from metallic air filled waveguides to the single mode dielectric waveguides.

Figure 4:
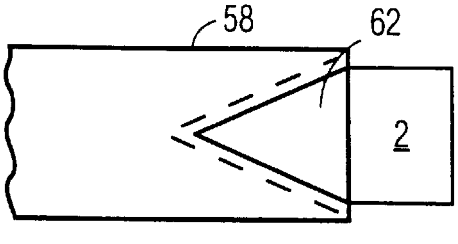
FIG. 4 illustrates coupling between a waveguide and a microstrip.

As shown in FIG. 3A, one conductor 36 of a microstrip 38 overlies one surface of the single mode waveguide 6, and the other conductor 40 of microstrip 38 extends over the other surface of the waveguide 6. A probe 42 extends into the waveguide 6 from the conductor 36. The conductor 36 is connected to a base electrode 44 of a transistor 46 having its emitter electrode 48 connected to the conductor 40 of the microstrip 38 and its collector electrode 50 connected via a resistor 52 to a point of D.C. voltage. The collector electrode 50 is also connected to a conductor 54 of the microstrip 38 that is electrically isolated from the conductor 36 and which extends over the top of the single mode waveguide 18. A probe 56 extends into the waveguide 18 from the conductor 54. The conductor 40 of the microstrip 38 extends over the other side of the waveguide 18. The conductors 36 and 54 are shown in FIG. 1. The coupling between the single mode waveguide 8 and the single mode waveguide is the same as just described. FIG. 3B is a top view of the transition of FIG. 3A, showing the top view of the conductors 36, 54 and probes 42, 56. FIG. 3C is a cross section of FIG. 3B, showing the cross section of conductors 36, 40 and probe 42. If the incoming signal to the input single mode waveguide 2 or the amplified signal from the output single mode waveguide 28 are conveyed by metallic waveguides, reflections can be reduced by a structure shown in FIG. 4 which shows the coupling between a metallic waveguide 58 and the input single mode waveguide 2 taken in the direction of the arrow 60 of FIG. 1. The dielectric waveguide 2 extends into the metallic waveguide 58 in the form of a V 62. This V shaped or tapered dielectric transition will reduce reflections from metallic air filled waveguides to the single mode dielectric waveguides.

It will be understood that more than two output peaks will be produced if the multimode waveguide 4 is extended farther along its z axis and that each of these peaks can be amplified and applied to a multimesh waveguide that combines them. Furthermore, each of the outputs of a multimode waveguide such as 4 can be applied to another multimode waveguide like the multimode waveguide 4 to get more than 2 maximum peaks. After amplification of the signals at each of outputs of the last waveguide, then can be combined by additional multimode waveguides, but in reverse order.

Although various embodiments of the present invention are shown and described herein, they are not meant to be limiting. Those of ordinary skill in the art may recognize various modifications to these embodiments, which modifications are meant to be covered by the spirit and scope of the appended claims.

What is claimed is:

1. A power divider/combiner comprising:

a first multimode waveguide having an input to which a single mode wave is coupled and a plurality of outputs where different modes of the single mode wave are combined to form maximum energy peaks;

a plurality of power amplifiers each having an input and an output, wherein the input of the power amplifiers are connected to the outputs of the first multimode waveguide at positions where the maximum energy peaks are formed; and a second multimode waveguide having a plurality of inputs each coupled to the plurality of power amplifiers, wherein the plurality of inputs constitute a plurality of single mode wave forms which are combined to form a single amplified output signal.

2. A power divider/combiner as set forth in claim 1 wherein the outputs of the first multimode waveguide and the inputs of the second multimode waveguide are coupled to single mode waveguides.

3. A power divider/combiner as set forth in claim 2 further comprising a transition means for coupling the single mode waveguide at an output of the first multimode waveguide to an input of the second multimode waveguide, the transition means comprising:

a microstrip having a first conductive surface and first and second electrically isolated portions of a second conductive surface;

the first portion of the second conductive surface and the second conductive surface being on opposite surfaces of a first single mode waveguide at an output of the first multimode waveguide;

a first probe extending from the first portion of the first conductive surface into the first single mode waveguide;

the second portion of the first conductive surface and the second conductive surface being on opposite surfaces of a second single mode waveguide which is at the input of the second multimode waveguide;

a second probe extending from the second portion of the first conductive surface in to the second single mode waveguide;

the input of the divider/combiner being coupled between the first portion of the second conductive surface of the microstrip and its first conductive surface; and the output of the divider/combiner being coupled between the second portion of the second conductive surface of the microstrip and its first conductive surface.

4. The power divider/combiner of claim 1 wherein the first and second multimode waveguides are formed of dielectric material.

5. The power divider/combiner of claim 1 wherein the first multimode waveguide is designed only to produce two maximum power peaks from the single mode wave.

* * * * *